United States Patent [19]
Ray et al.

[11] Patent Number: 6,138,567
[45] Date of Patent: Oct. 31, 2000

[54] METHOD OF PREPARING A PLANOGRAPHIC PRINTING MEMBER WITH A RADIATION SENSITIVE MEMBER

[75] Inventors: Kevin Barry Ray; Mark John Spowage, both of Leeds, United Kingdom; Christopher David McCullough, Fort Collins, Colo.

[73] Assignee: Kodak Polychrome Graphics LLC, Norwalk, Conn.

[21] Appl. No.: 09/373,858

[22] Filed: Aug. 13, 1999

Related U.S. Application Data

[63] Continuation of application No. PCT/GB98/00480, Feb. 13, 1998.

[30] Foreign Application Priority Data

Feb. 13, 1997 [GB] United Kingdom .................. 9702953

[51] Int. Cl.⁷ .................................................. G03C 11/12
[52] U.S. Cl. ...................... 101/463.1; 101/483; 101/467; 430/302; 430/253
[58] Field of Search ................................ 101/401.1, 453, 101/454, 456, 463.1, 465, 467, 483; 430/302, 253

[56] References Cited

U.S. PATENT DOCUMENTS

| 4,197,126 | 4/1980 | Wessells et al. ........................ 430/306 |
|---|---|---|
| 4,468,453 | 8/1984 | Nakamura et al. ..................... 430/269 |
| 5,688,629 | 11/1997 | Gries ....................................... 430/254 |
| 5,691,106 | 11/1997 | Gries ....................................... 430/254 |
| 5,776,655 | 10/1999 | West et al. .............................. 430/256 |
| 5,972,556 | 10/1999 | Leenders ................................ 430/200 |

FOREIGN PATENT DOCUMENTS

| 0559257 | 9/1993 | European Pat. Off. . |
|---|---|---|
| 0650094 | 4/1995 | European Pat. Off. . |
| 0665471 | 8/1995 | European Pat. Off. . |
| 0738932 | 10/1996 | European Pat. Off. . |
| 3-118154 | 5/1991 | Japan . |
| 1397567 | 6/1975 | United Kingdom . |
| 1563659 | 3/1980 | United Kingdom . |
| WO9303928 | 3/1993 | WIPO . |
| 94/01280 | 1/1994 | WIPO . |
| WO9610214 | 4/1996 | WIPO . |

*Primary Examiner*—John S. Hilten
*Assistant Examiner*—Daniel J. Colilla
*Attorney, Agent, or Firm*—Baker Botts L.L.P.

[57] ABSTRACT

A planographic printing plate includes a radiation sensitive layer which may comprise a rubber material. Application of heat causes exposed areas to be vulcanized. The plate may be developed by applying a force to the radiation sensitive layer, for example by rubbing, thereby to remove non-exposed areas.

24 Claims, 1 Drawing Sheet

METHOD OF PREPARING A PLANOGRAPHIC PRINTING MEMBER WITH A RADIATION SENSITIVE MEMBER

This is a continuation of copending application Serial No. PCT/GB98/00480 filed Feb. 13, 1998 which is incorporated by reference herein.

BACKGROUND OF THE INVENTION

This invention relates to planographic printing and provides a method of preparing a planographic printing member and a planographic printing member per se. The invention relates particularly, although not exclusively, to lithographic printing.

Lithographic processes involve establishing image (printing) and non-image (non-printing) areas on a substrate, substantially on a common plane. When such processes are used in printing industries, non-image areas and image areas are arranged to have different affinities for printing ink. For example, non-image areas may be generally hydrophilic or oleophobic and image areas may be oleophilic. In "wet" lithographic printing, a dampening or fountain (water-based) liquid is applied initially to a plate prior to application of ink so that it adheres to the non-image areas and repels oil based inks therefrom. In "dry" printing, ink is repelled from non-image areas due to their release property.

There are numerous known processes for creating image and non-image areas. Recently, much work has been directed towards processes which use laser imaging, in view of the ease with which lasers can be controlled digitally.

SUMMARY OF THE INVENTION

It is an object of the present invention to provide a novel planographic printing member and method of preparing the same.

According to the invention, there is provided a method of preparing a printing member comprising applying a force to non-exposed areas in a substantially dry process in order to remove said non-exposed areas.

Said printing member suitably comprises a support and a radiation sensitive layer which is suitably hydrophobic and/or oleophilic and the method preferably comprises information-wise exposing said radiation sensitive layer prior to application of said force. Said force is suitably arranged to remove said non-exposed areas of said radiation sensitive layer from said support.

In the method, non-exposed areas are suitably selectively removed so that exposed areas remain substantially intact.

Said force is preferably applied to both exposed and non-exposed areas. Said force is preferably applied across substantially the entire printing surface of said printing member. Said force is preferably applied by moving a force applying means which is in contact with said printing member, suitably in direct contact with said radiation sensitive layer thereof, relative to said printing member. Said force applying means may be moved over and/or across the printing member, suitably in a direction substantially parallel to a surface of the member. It may be moved back and forth as in a rubbing action. Alternatively and/or additionally, said force applying means may be moved away from the printing member.

Said force applying means may comprise a member which is brought into contact with said printing member in order to effect removal of said non-exposed areas or may comprise a member which is already in contact. For example, the latter described arrangement may comprise a cover means, such as a cover sheet in contact with the printing member and arranged to be removed by peeling thereby to remove said non-exposed areas. In this case, the adhesive force between the cover means and areas of the radiation sensitive layer before their exposure as compared to the force between the cover means and said areas after their exposure is substantially the same. Preferably, said force applying means is brought into contact with said printing member, especially the radiation sensitive layer thereof, suitably from a position where said force applying means is not in contact with said printing member.

Said force applying means preferably comprises a solid body, preferably a single solid body. Said force applying means is preferably substantially non-porous and/or non-absorbent. Said force applying means is preferably non-fluidic; it preferably does not comprise a multiplicity of solid particles, for example a powder or a gas jet.

Preferably, when the force applying means is in contact with said printing member, the adhesive force between said force applying means and said member is less than the adhesive force between said radiation sensitive layer and an underlying layer.

Said force applying means is preferably arranged to remove said non-exposed areas non-chemically. Preferably, said force applying means is arranged to physically overcome an adhesive force retaining said non-exposed areas in position.

Said force is preferably applied substantially in the absence of any liquid.

Preferably, the temperature of said non-exposed areas during application of said force is less than the melting point of said non-exposed areas and/or said exposed areas. Preferably, the temperature is less than the melting point of the radiation sensitive layer before and/or after exposure. Preferably, said force applying means and/or said non-exposed areas are at a temperature of less than 100° C., more preferably less than 70° C., especially less than 40° C. during application of said force. Most preferably, the application of said force is carried out at ambient temperature.

Preferably, a radiation sensitive layer of said printing member is arranged to be less susceptible to removal after exposure by application of said force compared to its susceptibility before exposure.

Preferably, said radiation sensitive layer exhibits different physical properties after exposure compared to before exposure. Preferably, the difference in physical properties enables said non-exposed areas to be removed in the method in preference to said exposed areas. For example, said radiation sensitive layer may become less plastic and/or sticky after exposure. The tensile strength of the radiation sensitive layer may increase after exposure. The elasticity of the radiation sensitive layer may be greater after exposure. The hardness of the radiation sensitive layer may be greater after exposure.

Preferably, exposure is arranged to cause a chemical reaction in exposed areas. Preferably, said radiation sensitive layer is chemically different after exposure compared to before exposure.

The radiation sensitive layer may have a rub value (as described in Test No. 1 hereinafter) of less than 15, preferably less than 10, more preferably less than 8, especially less than 6.

The radiation sensitive layer may have a rub value (as described in Test No. 2 hereinafter) of less than 100, preferably less than 90, more preferably less than 80, especially less than 70.

The radiation sensitive layer may have a tape value (as described hereinafter) of less than 30, preferably less than 15, more preferably less than 10, especially less than 8.

Said radiation sensitive layer preferably incorporates a material (hereinafter "said reactive material") adapted to have different physical properties after exposure compared to before exposure. Said reactive material is preferably a major component of said radiation sensitive layer. Said reactive material preferably has a glass transition temperature below 25° C. Preferably, said material is arranged to become less plastic and/or sticky after exposure. Preferably, the tensile strength of said material increases after exposure. Preferably, the elasticity of said material is greater after exposure than before exposure. Preferably, said reactive material is heat sensitive.

Preferably, said reactive material is arranged to be cross-linked upon exposure. More preferably, said reactive material is arranged to be vulcanized upon exposure.

Preferably, said reactive material comprises a rubber which may be natural, for example cis-polyisoprene or synthetic, for example being based on synthetic isoprene polymers, butyl rubbers, ethene-propene copolymers, vinyl polymers, styrene-butadiene, butadiene polymers or neoprene or the like.

Said rubber is preferably substantially water insoluble. It is preferably substantially soluble in organic solvents, for example cyclohexane.

Said reactive material may include more than one type of rubber, suitably blended together. For example, one rubber may be selected for its ability to be removed in the method and another may be selected for its ability to be imaged. An example of such an arrangement is a blend comprising styrene-butadiene copolymers having different amounts of styrene.

Said printing member preferably includes a radiation absorbing means. Said radiation absorbing means may be provided in a layer separate from said radiation sensitive layer and/or in the radiation sensitive layer itself. Preferably, said radiation absorbing means is provided in said radiation sensitive layer.

Where the radiation absorbing means is provided in said radiation sensitive layer, said means may constitute at least 1 wt %, suitably at least 2 wt %, preferably at least 3 wt %, more preferably at least 4 wt %, especially at least 5 wt % of said layer. Said radiation absorbing means may constitute less than 30 wt %, suitably less than 20 wt %, preferably less than 15 wt %, more preferably less than 10 wt %, especially less than 8 wt % of said layer.

Said radiation absorbing means is preferably a black body radiation absorber. Said radiation absorbing means may be a pigment. Said radiation absorbing means is usefully carbon, for example carbon black or graphite.

Said radiation sensitive layer may include a curing means which is arranged to aid curing of said reactive material on exposure.

Said radiation sensitive layer may include adhesion means for adjusting its adhesion to an underlying layer.

Said radiation sensitive layer is suitably in contact with a support which may be made of a material selected from metals, for example, aluminum, steel, zinc and copper foils, plastics films, for example polyethylene terephthalate or cellulose acetate films and perlon gauze. The support (which is suitably hydrophilic) may be subject to a pre-treatment (electrochemical, thermal or mechanical) with the aim of appropriately adjusting its properties. The support may include a hydrophilic layer of material. This may be applied using a fluid comprising a silicate, especially sodium silicate, and particulate material, as described in applicant's co-pending PCT application No. PCT/GB96/02883 the contents of which are incorporated herein by reference. An alternative hydrophilic layer may comprise an organic compound having cationic groups, as described in EP 0 601 240, the contents of which are incorporated herein by reference. Preferred organic compounds include dextrans and pullalan wherein at least some of the hydroxy groups have been modified into one or more of —$OR^1$ or —$OCOR^2$, wherein $R^1$ represents optionally-substituted, especially by amino or quaternary ammonium, alkyl or alkylaryl, and $R^2$ represents the same as $R^1$ or alkoxy or amino groups.

Said support, especially a layer thereof in contact with said radiation sensitive layer, is preferably non-absorbent.

Preferably, in the method, the printing member is exposed by application of radiation from a position which is closer to the radiation sensitive layer than a support on which the radiation sensitive layer may be provided. Application of radiation may be by means of the direct delivery of heat by a heated body or by use of incident electromagnetic radiation which may be converted to heat.

Preferably, in the method, the printing member is exposed by application of radiation in the near-IR region, suitably at above 600 nm and preferably between 700 nm and 1500 nm, using a laser.

The invention extends to a printing member comprising a support and a radiation-sensitive layer wherein non-exposed areas of said radiation-sensitive layer are arranged to be removed in a substantially dry process.

Said printing member may be as described in any statement herein. Preferably, said radiation sensitive layer comprises a rubber.

The invention extends to a method of constructing a printing member which comprises providing a layer which is arranged to be removed, prior to exposure, in a substantially dry process, over a support.

Preferably, said radiation sensitive material is applied from a non-aqueous solvent.

Any feature of any aspect of any invention or embodiment described herein may be combined with any feature of any other aspect of any invention or embodiment described herein.

DETAILED DESCRIPTION OF THE INVENTION

Figure 1:
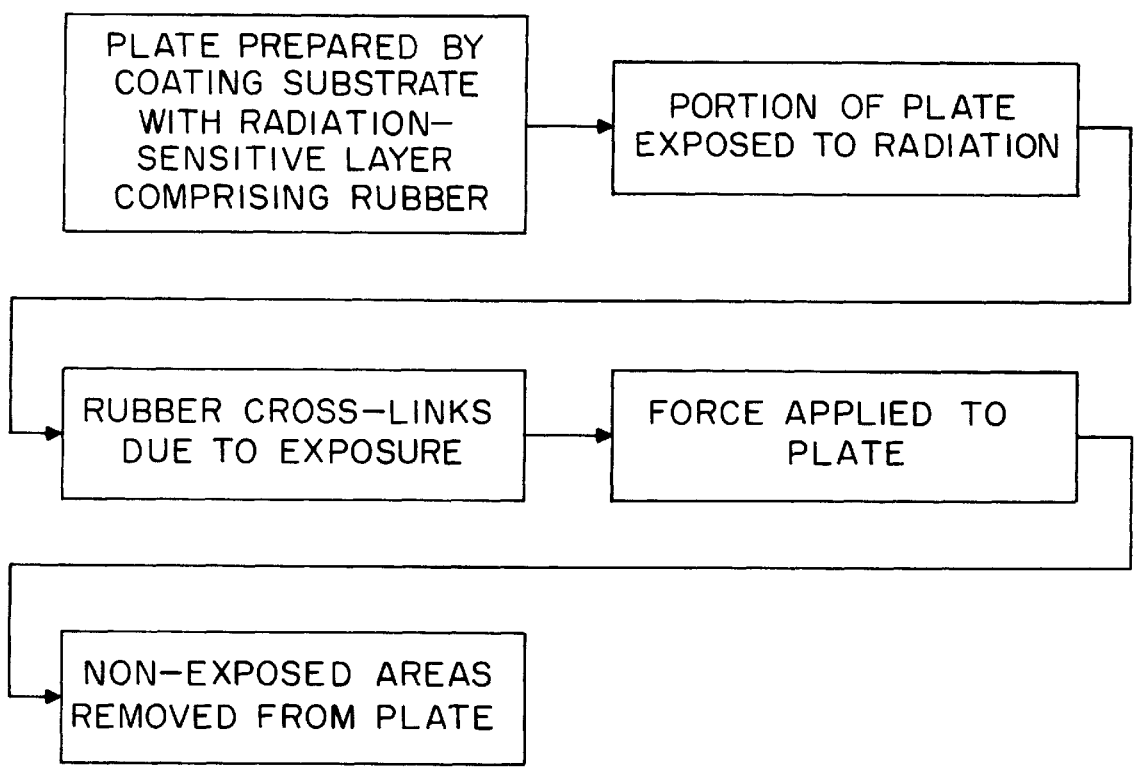
FIG. 1 is a flow chart showing the steps of he method of this invention.

The invention will now be described by way of example.
The following products are referred to hereinafter:
FINAPRENE 411—a styrene butadiene copolymer with 31.6 wt % bound styrene (100% solids), obtained from Fina Chemicals of Surrey, England.
FINAPRENE 1205—a styrene butadiene copolymer with 23 wt % bound styrene (100% solids), obtained from Fina Chemicals of Surrey, England.
Robac TMTD PM (Trade Mark)—pellets of tetramethylthiuram disulphide (75 wt %) in a polymeric binding system based on ethylene propylene rubber—a vulcanisation accelerator, obtained from Robinson Brothers Ltd. of West Bromwich, England.

Carbon black FW2—channel-type carbon black, obtained from Degussa of Macclesfield, England.

SBP 3 hydrocarbon—a hydrocarbon solvent obtained from Carless of Staffordshire, England.

DSP 80/110—a hydrocarbon solvent obtained from Exxon Chemical Ltd. of Southampton, England.

DSP 100/140—a hydrocarbon solvent obtained from Exxon Chemical Ltd. of Southampton, England.

Natural rubber—natural rubber pre-compounded with curing agents and carbon black (100% solids) in sheet form, obtained from Vita Industrial Polymers Ltd. of Salford, England.

Butyl rubber—butyl rubber pre-compounded with curing agents and carbon black (100% solids) in sheet form, obtained from Vita Industrial Polymers of Salford, England.

Peroxan DC 40 GS—dicumylperoxide—40% peroxide blended with calcium carbonate, obtained from Newgate Simms Ltd. of Chester, England.

Si 69—Bis(triethoxysilylpropyl)tetrasulphane—a silylether bonding agent for rubber, obtained from Degussa of Macclesfield, England.

Sodium silicate solution—refers to a sodium silicate solution having a ratio $SiO_2 : Na_2O$ in the range 3.17 to 3.45 (average about 3.3); a composition of 27.1–28.1 wt % $SiO_2$, 8.4–8.8 wt % $Na_2O$, with the balance being water; and a density of about 75 Twaddel (°Tw), equivalent to 39.5 Baumé (°Bé) and a specific gravity of 1.375.

Alumina powder—refers to a powder comprising alumina (99.6%) in the shape of hexagonal platelets. The mean particle size is 3 μm. The powder has a hardness of 9 Moh (on a 0–10 hardness scale).

Titanium dioxide—refers to a rutile titanium dioxide provided with an inorganic coating of $Al_2O_3$, ZnO and $ZnPO_1$. The mean crystal size is 0.23 μm.

Synthomer 76D40—a self-crosslinking butadiene/styrene copolymer latex (total solids 47%) obtained from Synthomer Ltd. of Grimsby, England.

Luconyl Black 0066—a 40 wt % pre-dispersed carbon black in water/2-butoxyethanol.

EXAMPLE 1

Preparation of plate comprising blend of SBS and SBR rubbers (a) Preparation of FINAPRENE 411 solution prepared by barrel rolling a mixture of FINAPRENE 411 (15 wt %) and cyclohexane (85 wt %) over 24 hours.

(b) Preparation of stearic acid solution prepared by barrel rolling stearic acid powder (10 wt %) and SBP 3 hydrocarbon (90 wt %) for 24 hours.

(c) Preparation of FINAPRENE 1205 solution prepared by barrel rolling FINAPRENE 1205 (30 wt %) and cyclohexane (70 wt %) for 24 hours.

(d) Preparation of tetramethylthiuram disulphide (TMTD) suspension prepared by barrel rolling TMTD pellets (15 wt %) and cyclohexane (85 wt %) for 24 hours.

(e) Preparation of styrene-butadiene (SBR) formulation

The following components were ball-milled for 5 days in a 500 ml porcelain ball mill using porcelain balls to give a final particle size of less than 6 μm measured using a Hegman/Grind gauge.

| Component | wt % | Parts |
|---|---|---|
| FINAPRENE 1205 solution prepared in (c) | 45.30 | 100 |
| TMTD suspension prepared in (d) | 0.99 | 0.8 |
| sulphur | 0.34 | 2.5 |
| zinc oxide | 0.68 | 5 |
| stearic acid solution prepared in (b) | 1.40 | 1 |
| carbon black FW2 | 6.12 | 45 |
| cyclohexane | 27.10 | — |
| SBP 3 hydrocarbon | 18.07 | — |

The total solids content of the formulation was about 21 wt %.

(g) Preparation of plate comprising blend of SBS and SBR rubbers

Suitable proportions of the SBS and SBR formulations prepared in Examples 1(a) and 1(e) were selected to give a final dry film content of 50 wt % SBR and 50 wt % SBS and were barrel rolled together for 1 hour prior to coating on a standard electrograined and anodised aluminum substrate to a coating weight in the range 1.7 to 2.7 $gm^{-2}$. The coating was then air-dried for 15 minutes.

EXAMPLES 2 to 4

Plates were prepared as described in Example 1 except that different proportions of the SBS and SBR formulations were used to give the dry film weights shown in the table below.

| Example | SBR Dry Film Content (wt %) | SBS Dry Film Content (wt %) |
|---|---|---|
| 2 | 70 | 30 |
| 3 | 85 | 15 |
| 4 | 90 | 10 |

EXAMPLE 5

Preparation of plate comprising blend of SBS and SBR rubbers and a bonding additive The following components were barrel rolled for 1 hour to produce a coating formulation which was then coated over a standard electrograined and anodised aluminum substrate to a coating weight in the range 2.0 to 3.1 $gm^{-2}$, followed by oven drying at 80° C. for 1 minute.

| Component | wt % |
|---|---|
| SBR formulation of example 1 (e) | 56.5 |
| SBS formulation of example 1 (a) | 10.0 |
| Cyclohexane | 28.5 |
| Si 69 bonding additive | 5.0 |

EXAMPLE 6

A plate was prepared as described in Example 5 except that the amount of Si 69 was changed as shown below.

| Component | wt % |
|---|---|
| SBR formulation of example 1 (e) | 59.15% |
| SBS formulation of example 1 (a) | 10.45 |
| Cyclohexane | 29.8 |
| Si 69 bonding additive | 0.6 |

EXAMPLE 7

Preparation of plate using Si 69 as curing agent

The following components were ball-milled for 70 hours to prepare a formulation which was coated onto a standard electrograined and anodised aluminum substrate to a coating weight in the range 3.3 to 5.2 $gm^{-2}$, followed by oven-drying at 80° C. for 1 minute.

| Component | wt % |
|---|---|
| FINAPRENE 1205 | 10.9 |
| FINAPRENE 411 | 2.7 |
| TMTD | 0.1 |
| Zinc Oxide | 0.7 |
| Carbon Black FW2 | 6.2 |
| Cyclohexane | 77.9 |
| Si 69 | 1.5 |

EXAMPLE 8

Preparation of plate comprising latex rubber (a) Preparation of rubber solution prepared by barrel rolling a mixture comprising Synthomer 76D40 (62.6 wt %) and Luconyl Black 0066 (37.4 wt %) for 1 hour.

(b) Preparation of plate

A standard electrograined and anodized (but not phosphated) aluminum substrate was coated with the rubber solution prepared in (a) to a thickness in the range 6.6 to 10.5 $gm^{-2}$, followed by oven drying at 80° C. for 4 minutes.

EXAMPLE 9

Preparation of plate incorporating substrate coated with a hydrophilic layer (a) Preparation of aluminum A 0.3 mm gauge aluminum alloy sheet of designation AA1050 was immersed face up in a solution of sodium hydroxide dissolved in distilled water (100 g/l) at ambient temperature for 60 seconds and thoroughly rinsed with water.

(b) Preparation of hydrophilic coating formulation

Deionised water (48 g; 24 wt %) and sodium silicate solution (80 g; 40 wt %) were added to a 250 ml beaker and the solution sheared using a Silverson high shear mixer operating at maximum speed. Titanium dioxide powder (36 g; 18 wt %) was then added in portions of approximately 2 g every ten seconds. On completion of the addition, the liquid was sheared for a further two minutes. Then, alumina powder (36 g; 18 wt %) was added in portions of approximately 2 g every ten seconds. On completion of the addition, the liquid was sheared for a further two minutes. The viscosity of the liquid is found to be about 10 centipoise when measured at 20° C. and a shear rate of $200s^{-1}$ using a Mettler Rheomat 180 Viscometer incorporating a double gap measuring geometry.

(c) Preparation of plate

The coating formulation prepared in (b) was coated onto the aluminum sheet prepared in (a) using a rotating Meyer bar coater (designation K303) to give a 6 μm wet film thickness. The coated sheet was placed in an oven at 130° for 80 seconds and then removed and allowed to cool to ambient temperature.

Next the coating formulation described in Example 8(a) was applied as described in Example 8(b).

EXAMPLE 10

Preparation of plate using natural rubber

Natural rubber (15 wt %) in sheet form and precompounded with carbon black and other components necessary for vulcanisation was cut into small pieces and dissolved in cyclohexane (85 wt %) by barrel rolling for 24 hours. The formulation was then coated to a coating weight in the range 2.2 to 3.6 $gm^{-2}$ onto a standard electrograined and anodised aluminum substrate, followed by oven drying at 80° C. for 1 minute.

EXAMPLE 11

Preparation of plate using butyl rubber

The procedure of Example 10 was followed except that butyl rubber was used instead of natural rubber.

EXAMPLE 12

Testing of plates (a) Rub Test No. 1

An uncured (i.e. unexposed) plate is rubbed, after at least one hour but less than three hours after drying of the rubber formulations on the substrate, with the middle finger of the dominant hand in a straight line 2 inches long and the width of the finger end. The test is complete when the area rubbed is free of rubber residue and the number of rubs (wherein one rub comprises one up and down movement) taken to achieve this is noted. Results are provided in Table A below. A rub value of 1 is most desirable and a rub value of 10 is unacceptable.

(b) Rub Test No. 2

An uncured (ie. unexposed) plate is placed in a Wet Abrasion Scrub Tester model number 903 supplied by Sheen Instruments Ltd of Kingston, UK fitted with a carriage assembly to give applied loading of 250 g including two hog bristle brushes as defined in DIN 53778 part 2 August 1983. The machine is operated dry. The number of strokes required to completely remove the coating in the area defined by the brushes' stroke is recorded as the rub value in Table A below. A rub value of greater than 100 is unacceptable.

(c) Tape Test

The test is performed after at least one hour but less than three hours after drying of the rubber formulations on the substrate. The test is performed using Chemical Hazard Warning Tape available from BDH Laboratory Supplies under the 1996 catalogue number 245/0116/14.

In the test, a length of tape approximately three inches long is applied to the dried but uncured coating, taking care that there are no air bubbles present, and rubbed firmly so as to bond it to the rubber coating as well as possible. The tape is then pulled away from the substrate in a smooth manner at a speed of about $2cms^{-1}$.

The approximate percentage of uncured coating remaining on the substrate in a representative area 1 inch square is then visually assessed and a tape value attributed to the coating to indicate the percentage remaining, wherein a value of 0 represents 0% of the coating remaining and a value of 10 represents 10% remaining. Results are provided (where available) in Table A below.

(d) Imaging and processing of the plates

Plates prepared in selected examples were cut into discs of 105 mm diameter and placed on a rotatable disc that could be rotated at a constant speed of 120 revolutions per minute. Adjacent to the rotatable disc, a translating table held a laser beam source so that it impinged normal to the disc, while the translating table moved the laser beam radially in a linear fashion with respect to the rotatable disc. The exposed image was in the form of a spiral whereby the image in the centre of the spiral represented slow laser scanning speed and long exposure time and the outer edge of the spiral represented fast scanning speed and short exposure time.

The laser used was a single mode 830 nm wavelength 200 mW laser diode which was focused to a 10 micron spot. The laser power supply was a stabilised constant current source.

After exposure, the plate was rubbed with the middle finger of the dominant hand and non-exposed areas were selectively removed.

Results are provided in Table A below wherein the diameter of the image after removal of the non-image area is noted.

Results

TABLE A

| Example No. | Rub Tests (rub value) | | Tape Test (tape value) | Imaging Results (diameter of image in cm) |
|---|---|---|---|---|
| | Test No. 1 | Test No. 2 | | |
| 1 | 3 | 35 | 5 | 4 |
| 2 | 3 | 35 | 10 | 4 |
| 3 | 3 | 35 | 10 | 4 |
| 4 | 4 | 40 | 10 | 4 |
| 5 | >10 | >100 | 5 | 10 |
| 6 | 3 | 35 | 10 | 4 |
| 7 | 4 | 65 | >10 | 6 |
| 8 | 9 | >100 | 10 | 2.5 |
| 9 | >10 | >100 | 10 | 4 |
| 10 | 2 | 20 | 0 | 1 |
| 11 | 5 | >100 | 0 | 5 |

The reader's attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

We claim:

1. A method of preparing a planographic printing member for planographic printing, wherein said printing member comprises a radiation sensitive layer which is adapted to have different physical properties after exposure compared to before exposure, the method comprising:

providing said radiation-sensitive layer having a reactive material comprising a cross-linkable rubber;

information-wise exposing said printing member to generate heat in said radiation sensitive layer thereby to cause said rubber to cross-link upon exposure and cause a change in the physical properties of said radiation sensitive layer in said exposed areas; and applying a force to non-exposed areas in a substantially dry process in order to remove said non-exposed areas.

2. A method according to claim 1, wherein said force is applied to both exposed and non-exposed areas and said force selectively removes said non-exposed areas.

3. A method according to claim 1, wherein said force is applied by moving a force applying means which is in contact with said printing member.

4. A method according to claim 3, wherein said force applying means comprises a member which after exposure is brought into contact with said printing member in order to effect removal of said non-exposed areas.

5. A method according to claim 3, wherein said force applying means comprises a cover means in contact with the printing member and arranged to be removed by peeling thereby to remove said non-exposed areas.

6. A method according to claim 4, wherein said force applying means is arranged to physically overcome an adhesive force retaining said non-exposed areas in position.

7. A method according to claim 1, wherein said force applying means comprises a single solid body.

8. A method according to claim 1, wherein the temperature of said non-exposed areas during application of said force is less than the melting point of said non-exposed areas.

9. A method according to claim 1, wherein said force is applied using a force applying means at a temperature of less than 100° C.

10. A method according to claim 1, wherein said reactive material has a glass transition temperature below 25° C.

11. A method according to claim 10, wherein said radiation sensitive material is arranged to become less plastic after exposure.

12. A method according to claim 10, wherein the tensile strength of said radiation sensitive material increases after exposure.

13. A method according to claim 10, wherein the elasticity of said radiation sensitive material is greater after exposure than before exposure.

14. A method according to claim 10, wherein said radiation sensitive material includes more than one type of rubber.

15. A method according to claim 1, wherein said printing member is information-wise exposed by direct delivery of heat by a heated body or by use of incident electromagnetic radiation.

16. A method according to claim 1, wherein said printing member is information-wise exposed by application of radiation between 700 nm and 1500 nm using a laser.

17. A method according to claim 1, wherein said rubber is vulcanized on said information-wise exposure.

18. A method according to claim 1, wherein said printing member includes a radiation absorbing means.

19. A method according to claim 18, wherein said radiation absorbing means is a black body radiation absorber.

20. A method of preparing a planographic printing member for planographic printing, wherein said printing member comprises a radiation sensitive layer which is adapted to have different physical properties after exposure compared to before exposure, providing said radiation-sensitive layer having the method comprising:

provviding said radiation-sensitive layer having a reactive material comprising a cross-linkable rubber having a glass transition temperature below 25 degrees Celsius;

information-wise exposing said printing member to generate heat in said radiation sensitive layer thereby to cause said rubber to cross-link and cause a change in the physical properties of said radiation sensitive layer in said exposed areas; and applying a force to non-exposed areas in a substantially dry process in order to remove said non-exposed areas, wherein said force applying means comprises a member which is brought into contact with said printing member after the exposure of said printing member in order to effect removal of said non-exposed areas.

21. A method according to claim 20, wherein said radiation sensitive material is arranged to become less plastic after exposure.

22. A method according to claim 20, wherein the tensile strength of said radiation sensitive material increases after exposure.

23. A method according to claim 20, wherein the elasticity of said radiation sensitive material is greater after exposure than before exposure.

24. A method according to claim 20, wherein said radiation sensitive material includes more than one type of rubber.

* * * * *

UNITED STATES PATENT AND TRADEMARK OFFICE
CERTIFICATE OF CORRECTION

PATENT NO. : 6,138,567
DATED : October 31, 2000
INVENTOR(S) : Ray et al.

It is certified that error appears in the above-identified patent and that said Letters Patent is hereby corrected as shown below:

Column 4,
Line 51, "he" should read -- the --

Column 11,
Lines 5-6, "providing said radiation sensitive layer having" should be deleted Signed and Sealed this Twenty-ninth Day of January, 2002

Attest:

JAMES E. ROGAN
Attesting Officer    Director of the United States Patent and Trademark Office